United States Patent
Tabata et al.

(10) Patent No.: US 10,707,100 B2
(45) Date of Patent: Jul. 7, 2020

(54) PROCESSING METHOD AND PLASMA PROCESSING APPARATUS

(71) Applicant: TOKYO ELECTRON LIMITED, Tokyo (JP)

(72) Inventors: Masahiro Tabata, Miyagi (JP); Toru Hisamatsu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/214,870

(22) Filed: Dec. 10, 2018

(65) Prior Publication Data

US 2019/0378730 A1 Dec. 12, 2019

(30) Foreign Application Priority Data

Jun. 7, 2018 (JP) ................................ 2018-109678

(51) Int. Cl.
| | |
|---|---|
| *H01L 21/67* | (2006.01) |
| *C23C 16/455* | (2006.01) |
| *C23C 16/48* | (2006.01) |
| *C23C 16/52* | (2006.01) |
| *C23C 16/56* | (2006.01) |
| *C23C 16/50* | (2006.01) |
| *H01L 21/3065* | (2006.01) |

(52) U.S. Cl.
CPC .. *H01L 21/67069* (2013.01); *C23C 16/45536* (2013.01); *C23C 16/45544* (2013.01); *C23C 16/482* (2013.01); *C23C 16/50* (2013.01); *C23C 16/52* (2013.01); *C23C 16/56* (2013.01); *H01L 21/3065* (2013.01)

(58) Field of Classification Search
CPC ......... H01L 21/67069; H01L 21/67109; H01L 21/6831; H01L 21/0206; H01L 21/0212; H01L 21/02205; H01L 21/0228; H01L 21/31138; H01L 21/3065; C23C 16/482; C23C 16/56; C23C 16/50; C23C 16/52; C23C 16/45544; C23C 16/45536; C23C 16/0227; C23C 16/45553; C23C 16/46; H01J 2237/002; H01J 2237/3321; H01J 2237/3327; H01J 2237/3341
USPC ....... 438/706, 710, 714, 719, 720, 756, 758, 438/762, 715
See application file for complete search history.

(56) References Cited

U.S. PATENT DOCUMENTS

| | | | |
|---|---|---|---|
| 10,043,657 B2* | 8/2018 | Swaminathan | ......... H01L 43/12 |
| 2012/0231626 A1* | 9/2012 | Lee | ................... H01L 21/28556 438/653 |

(Continued)

*Primary Examiner* — Lan Vinh
(74) *Attorney, Agent, or Firm* — Rothwell, Figg, Ernst & Manbeck, P.C.

(57) ABSTRACT

A substrate processing method includes: selectively forming a first film on a surface of a substrate disposed in a processing container by plasma enhanced vapor deposition (PECVD); and forming a second film by atomic layer deposition (ALD) in a region of the substrate where the first film does not exist. The second film is formed by repeatedly performing a sequence including: forming a precursor layer on the surface of the substrate; purging an interior of the processing container after forming of the precursor; converting the precursor layer into the second film; and purging a space in the processing container after the converting. A plasma processing apparatus performing the method is also provided.

20 Claims, 11 Drawing Sheets

(56) References Cited

U.S. PATENT DOCUMENTS

| | | |
|---|---|---|
| 2015/0380302 A1* | 12/2015 | Mountsier ......... H01L 21/76831 438/654 |
| 2017/0140983 A1 | 5/2017 | Leschkies et al. |
| 2018/0061628 A1* | 3/2018 | Ou ...................... H01L 21/0228 |
| 2018/0301347 A1 | 10/2018 | Kihara et al. |
| 2019/0096680 A1 | 3/2019 | Wei et al. |

* cited by examiner

PROCESSING METHOD AND PLASMA PROCESSING APPARATUS

CROSS-REFERENCE TO RELATED APPLICATIONS

This application is based on and claims priority from Japanese Patent Application No. 2018-109678 filed on Jun. 7, 2018 with the Japan Patent Office, the disclosure of which is incorporated herein in its entirety by reference.

TECHNICAL FIELD

An exemplary embodiment of the present disclosure relates to a processing method and a plasma processing apparatus.

BACKGROUND

With a decrease in a device size, there is an increasing need for an atomic scale processing such as the atomic layer deposition (ALD). U.S. Patent Laid-Open Publication No. 2017/0140983 discloses a technology that selectively forms a film on a bottom portion of a pattern by using plasma modification and atomic layer deposition.

SUMMARY

An embodiment provides a substrate processing method. The processing method includes: selectively forming a first film on a surface of a substrate disposed in a processing container by plasma enhanced chemical vapor deposition (PECVD); and forming a second film by atomic layer deposition (ALD) in a region where the first film does not exist.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENTS

Figure 1:
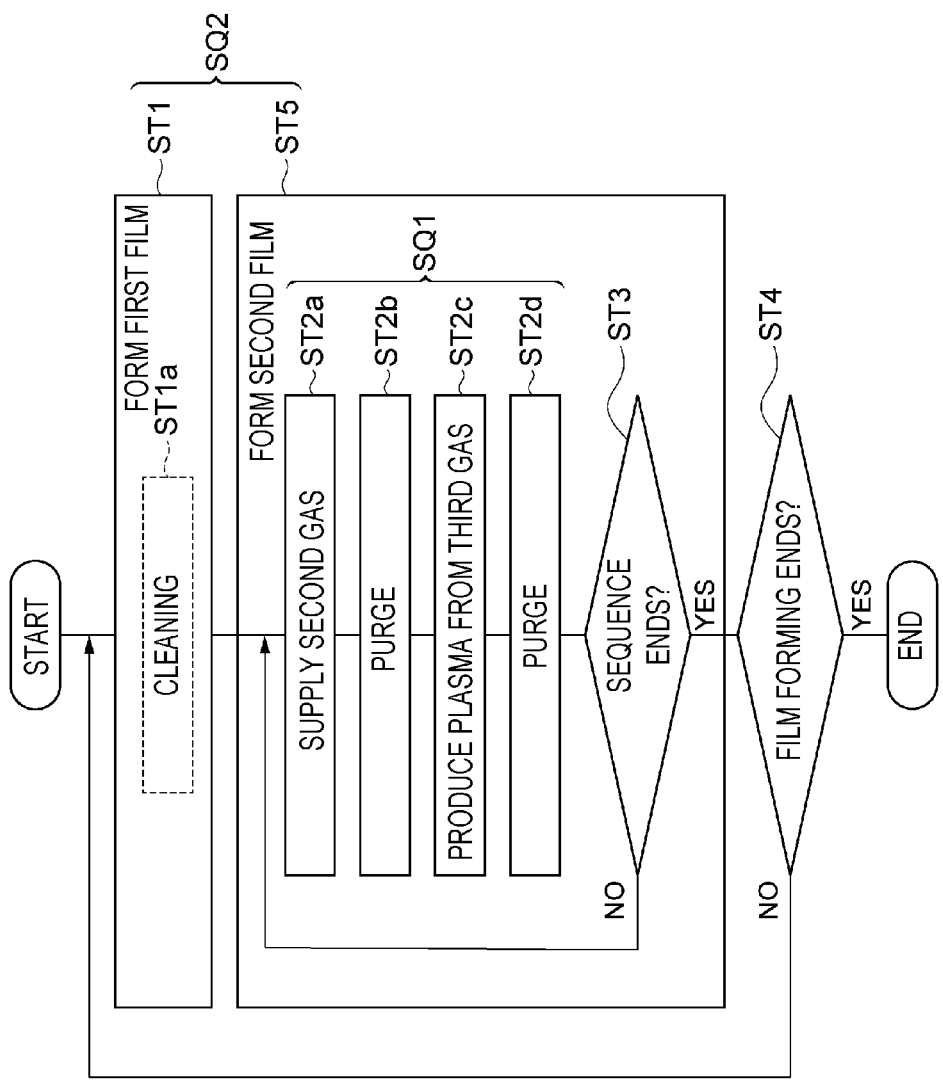
FIG. 1 is a flowchart illustrating a processing method according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure provides a technology that improves a selective processing controllability.

An embodiment provides a substrate processing method. The processing method includes: a first process of selectively forming a first film on a surface of a substrate disposed in a processing container by plasma enhanced chemical vapor deposition (PECVD); and a second process of forming a second film by atomic layer deposition (ALD) in a region where the first film does not exist.

In the above-described substrate processing method, the first process and the second process can be repeatedly performed.

In the above-described substrate processing method, the region where the first film does not exist can be a region where the first film is not formed in the first process.

In the above-described substrate processing method, the region where the first film does not exist can also or alternately include a region in which the first film formed in the first process is removed by a plasma processing before the second process or in the second process.

In the above-described substrate processing method, the first process can also form the first film on the surface of the substrate, and then remove the first film on the surface of the substrate.

In the above-described substrate processing method, the second process can form the second film by repeatedly performing a sequence including: a third process of forming a precursor layer on the surface of the substrate by supplying a gaseous precursor into the processing container; a fourth process of purging an interior of the processing container after the third process; a fifth process of converting the precursor layer into the second film by exposing the precursor layer to plasma for modification in the processing container after the fourth process; and a sixth process of purging a space in the processing container after the fifth process.

In the above-described substrate processing method, the gaseous precursor is any one of an aminosilane-based gas, a silicon-containing gas, a titanium-containing gas, a hafnium-containing gas, a tantalum-containing gas, a zirconium-containing gas, or an organic substance-containing gas, and the plasma for modification is produced from any one of an oxygen-containing gas, a nitrogen-containing gas, or a hydrogen-containing gas.

In the above-described substrate processing method, when the sequence is repeatedly performed, conditions of the fifth process are different between when the process is performed for the $n^{th}$ (n is a positive integer) time and when the process is performed for the $(n+1)^{th}$ time.

In the above-described substrate processing method, the first process and the second process can be consecutively performed in the same processing container in a state where a vacuum is maintained in the processing container.

The above-described substrate processing method can further include: etching the substrate in the processing container before the first process; and etching the substrate in the processing container after the second process.

In the above-described substrate processing method, when the first process and the second process are repeatedly performed, conditions of the first processes are different between when the process is performed for the $m^{th}$ (m is a positive integer) time and when the process is performed for the $(m+1)^{th}$ time.

Another embodiment provides a substrate processing method. The substrate processing method includes: a first process of selectively forming a first film on a surface of a substrate disposed in a processing container by plasma enhanced chemical vapor deposition (PECVD); and a second process of forming a second film by atomic layer deposition (ALD) on a surface of the substrate where the first film does not exist, in which the second process forms a precursor layer in a region of the substrate where the first film does not exist, by supplying a gaseous precursor into the processing container, purges an interior of the processing container, and converts the precursor layer into the second film by exposing the precursor layer to plasma for modification in the processing container, and the plasma for modification reduces a film thickness of the first film.

In the above-described substrate processing method, the first process and the second process can be repeatedly performed.

In the above-described substrate processing method, the second film has a film thickness that varies at different regions of the surface.

Still another embodiment provides a plasma processing apparatus. The plasma processing apparatus includes: a processing container configured to accommodate a substrate; and a controller configured to control a processing performed on the substrate in the processing container, in which the controller has a sequence performing unit which repeatedly performs a sequence including a first process of selectively forming a first film on aa selective region of surface of the substrate disposed in the processing container by using plasma enhanced chemical vapor deposition (PECVD), and a second process of forming a second film by atomic layer deposition (ALD) in a region of the surface where the first film does not exist.

As described above, it is possible to improve a selective processing controllability.

Hereinafter, various embodiments will be described in detail with reference to the drawings. Further, in the respective drawings, like parts or corresponding parts will be designated by like reference numerals.

FIG. 1 is a flowchart illustrating a method of processing a substrate (hereinafter, also referred to as a wafer W) according to an embodiment. Method MT is an embodiment of a processing method. Method MT is performed by a plasma processing apparatus.

Figure 2:
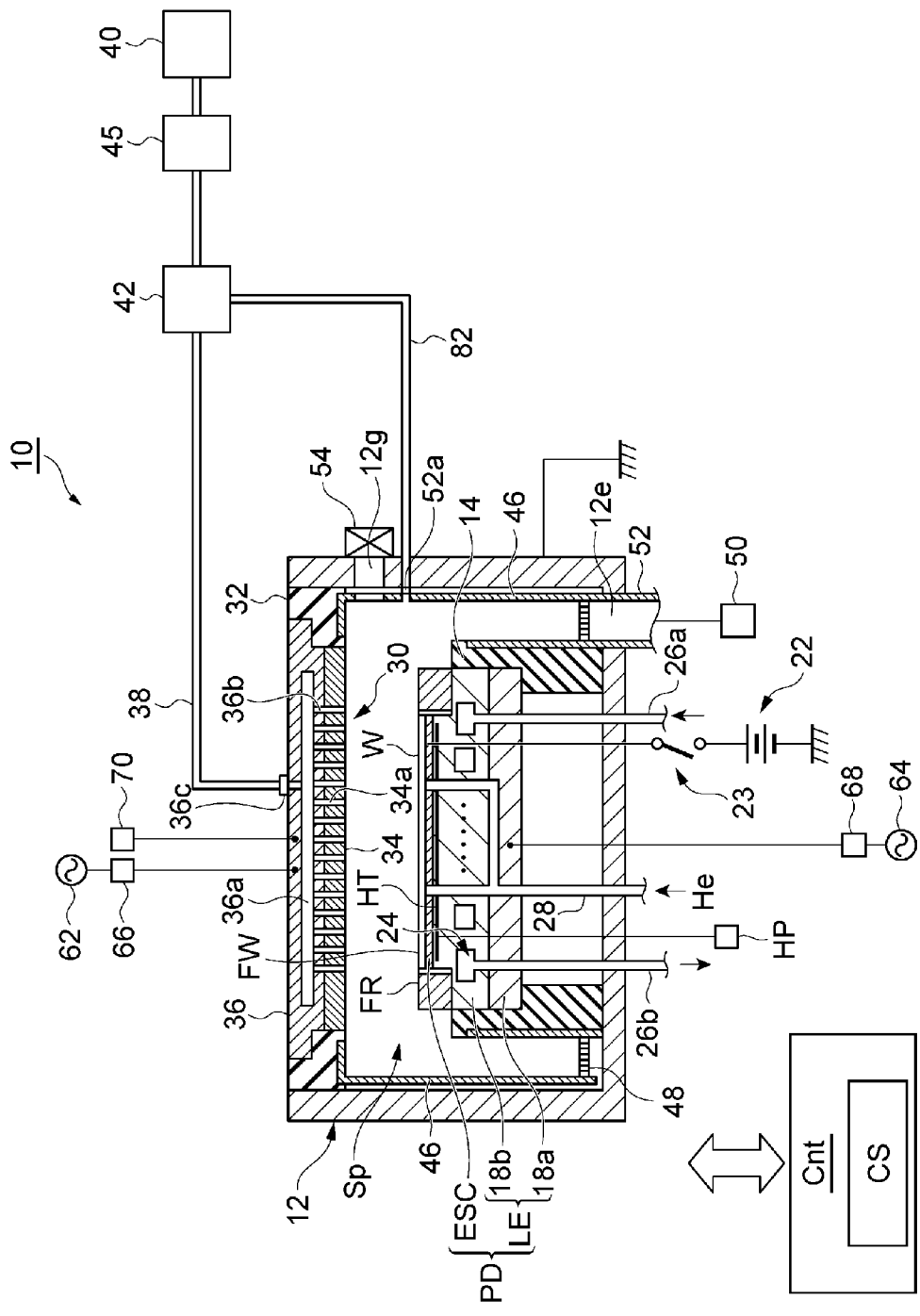
FIG. 2 is a view illustrating an example of a configuration of a plasma processing apparatus that performs the method illustrated in the flowchart in FIG. 1.

FIG. 2 is a view illustrating an example of the plasma processing apparatus according to the embodiment which is used for method MT. FIG. 2 schematically illustrates a cross-sectional structure of a plasma processing apparatus 10 that may be used for various embodiments of method MT. The plasma processing apparatus 10 includes a processing container 12 having a parallel plate type electrode. The processing container 12 accommodates the wafer W. The processing container 12 has an approximately cylindrical shape, and defines a processing space Sp. The processing container 12 is made of, for example, aluminum, and an inner wall surface of the processing container 12 is anodized. The processing container 12 is grounded for safety.

An approximately cylindrical support unit 14 is provided on a bottom portion of the processing container 12. The support unit 14 is made of, for example, an insulating material. The support unit 14 vertically extends from the bottom portion of the processing container 12. In addition, a placing table PD is provided to be supported by the support unit 14.

The placing table PD retains the wafer W on an upper surface thereof. The placing table PD has a lower electrode LE and an electrostatic chuck ESC. The lower electrode LE includes a first plate 18a and a second plate 18b. The first plate 18a and the second plate 18b are made of metal such as aluminum and each have an approximately disc shape. The second plate 18b is provided on the first plate 18a and electrically connected to the first plate 18a.

The electrostatic chuck ESC is provided on the second plate 18b. The electrostatic chuck ESC has a structure in which an electrode, which is a conductive film, is disposed between a pair of insulating layers or a pair of insulating sheets. A DC power source 22 is electrically connected to an electrode of the electrostatic chuck ESC through a switch 23. The electrostatic chuck ESC attracts the wafer W with an electrostatic force such as a Coulomb's force generated by a DC voltage from the DC power source 22.

A focus ring FR is disposed on a peripheral portion of the second plate 18b so as to surround an edge of the wafer W and the electrostatic chuck ESC. The focus ring FR is provided to improve uniformity of etching. The focus ring FR is made of a material which is selected depending on a material of a film to be etched, and the focus ring FR may be made of, for example, quartz.

A coolant flow path 24 is provided in the second plate 18b. The coolant flow path 24 is a part of a temperature regulating mechanism. A coolant is supplied into the coolant flow path 24 through a pipe 26a from a chiller unit (not illustrated) provided outside the processing container 12. The coolant supplied into the coolant flow path 24 returns to the chiller unit through a pipe 26b. In this way, the coolant is supplied into the coolant flow path 24 so that the coolant circulates in the coolant flow path 24. A temperature of the wafer W is controlled by controlling a temperature of the coolant.

A gas supply line 28 is provided in the plasma processing apparatus 10. The gas supply line 28 supplies heat transfer gas, for example, He gas from a heat transfer gas supply mechanism to a portion between an upper surface of the electrostatic chuck ESC and a rear surface of the wafer W.

In addition, a temperature adjusting unit HT such as a heater is provided in the plasma processing apparatus 10. The temperature adjusting unit HT is embedded in the second plate 18b. A heater power source HP is connected to the temperature adjusting unit HT. As electric power is supplied to the temperature adjusting unit HT from the heater power source HP, such that a temperature of the electrostatic chuck ESC is adjusted, and thus a temperature of the wafer W is adjusted. Further, the temperature adjusting unit HT may be embedded in the electrostatic chuck ESC.

The plasma processing apparatus 10 has an upper electrode 30. The upper electrode 30 is disposed above the placing table PD and faces the placing table PD. The lower electrode LE and the upper electrode 30 are provided approximately in parallel with each other. The processing space Sp is provided between the upper electrode 30 and the lower electrode LE to perform the plasma processing on the wafer W.

The upper electrode 30 is supported on an upper portion of the processing container 12 through an insulating shielding member 32. The upper electrode 30 may include an electrode plate 34 and an electrode support body 36. The electrode plate 34 faces the processing space Sp and has multiple gas discharge holes 34a. In an embodiment, the electrode plate 34 contains silicon.

The electrode support body 36 detachably supports the electrode plate 34. The electrode support body 36 is made of, for example, a conductive material such as aluminum. The electrode support body 36 may have a cooling structure. A gas diffusion chamber 36a is provided in the electrode support body 36. Multiple gas flow holes 36b, which are in communication with the gas discharge holes 34a, extend from the gas diffusion chamber 36a to the processing space Sp. In addition, the electrode support body 36 is provided with a gas introducing port 36c that guides a processing gas to the gas diffusion chamber 36a, and a gas supply pipe 38 is connected to the gas introducing port 36c.

The plasma processing apparatus 10 has a first high-frequency power source 62 and a second high-frequency power source 64. The first high-frequency power source 62 is a power source that generates first high-frequency electric power for producing plasma and generates high-frequency electric power having a frequency of 27 MHz to 100 MHz, for example, 60 MHz. The first high-frequency power source 62 is connected to the upper electrode 30 via a matcher 66. The matcher 66 is a circuit that matches output impedance of the first high-frequency power source 62 and input impedance at a load side (lower electrode LE side). Further, the first high-frequency power source 62 may be connected to the lower electrode LE via the matcher 66.

The second high-frequency power source 64 is a power source that generates second high-frequency electric power for drawing ions into the wafer W and generates high-frequency bias electric power having a frequency ranging from 400 kHz to 40.68 MHz, for example, a frequency of 13.56 MHz. The second high-frequency power source 64 is connected to the lower electrode LE via a matcher 68. The matcher 68 is a circuit that matches output impedance of the second high-frequency power source 64 and input impedance at the load side (lower electrode LE side).

The plasma processing apparatus 10 may further have a power source 70. The power source 70 is connected to the upper electrode 30. The power source 70 applies a voltage, which is used to draw positive ions existing in the processing space Sp into the electrode plate 34, to the upper electrode 30. As an example, the power source 70 generates a negative DC voltage. When the voltage is applied to the upper electrode 30 from the power source 70, the positive ions existing in the processing space Sp are drawn into the electrode plate 34. The drawn ions collide with the electrode plate 34, such that secondary electrons and/or silicon are emitted from the electrode plate 34.

A gas discharge plate 48 is provided between the support unit 14 and a sidewall of the processing container 12. The gas discharge plate 48 may be configured, for example, by coating an aluminum member with ceramics such as $Y_2O_3$. A gas discharge port 12e is provided at a lower side of the gas discharge plate 48. A gas discharge device 50 is connected to the gas discharge port 12e through a gas discharge pipe 52 and reduces pressure in the processing space Sp. A carry-in/out port 12g for the wafer W is provided in the sidewall of the processing container 12, and the carry-in/out port 12g is opened or closed by a gate valve 54.

A gas source group 40 has multiple gas sources. A valve group 42 includes multiple valves. A flow rate controller group 45 includes multiple flow rate controllers such as mass flow controllers.

The plasma processing apparatus 10 may have a post-mixing type structure in which a pipe for supplying a gas having high reactivity such as an aminosilane-based gas and a pipe for supplying another gas are independently provided to the processing space Sp and the gases are mixed in the processing space Sp. The post-mixing type structure has the gas supply pipe 38 and a gas supply pipe 82. The gas supply pipe 38 and the gas supply pipe 82 are connected to the gas source group 40 through the valve group 42 and the flow rate controller group 45. In the post-mixing type structure of the plasma processing apparatus 10, a gas line connected to the gas supply pipe 38 and a gas line connected to the gas supply pipe 82 are independently provided between the gas source group 40 and the valve group 42. In this case, the gas flowing through the gas supply pipe 38 and the gas flowing through the gas supply pipe 82 are not mixed until the respective gases are supplied into the processing container 12.

The gas introducing port 36c is provided in the electrode support body 36. The gas introducing port 36c is provided above the placing table PD. The gas introducing port 36c is connected to a first end of the gas supply pipe 38. A second end of the gas supply pipe 38 is connected to the valve group 42. The gas is introduced, through the gas introducing port 36c, into the gas diffusion chamber 36a formed in the electrode support body 36.

A gas introducing port 52a is provided in the sidewall of the processing container 12. The gas introducing port 52a is connected to a first end of the gas supply pipe 82. A second end of the gas supply pipe 82 is connected to the valve group 42.

A deposit shield 46 is detachably provided in the plasma processing apparatus 10 along the inner wall of the processing container 12. The deposit shield 46 is also provided around an outer periphery of the support unit 14. The deposit shield 46 inhibits deposits from being attached to the processing container 12. The deposit shield 46 is configured by coating aluminum with ceramics such as $Y_2O_3$.

The plasma processing apparatus 10 may have a controller Cnt. The controller Cnt controls the processing performed on the wafer W in the processing container 12. The controller Cnt is a computer having, for example, a processor, a storage unit, an input device, and a display device, and controls respective parts of the plasma processing apparatus 10. The controller Cnt is connected to, for example, the valve group 42, the flow rate controller group 45, the gas discharge device 50, the first high-frequency power source 62, the matcher 66, the second high-frequency power source 64, the matcher 68, the power source 70, and the heater power source HP. Further, the controller Cnt may control a flow rate and a temperature of a coolant from the chiller unit.

The controller Cnt has a sequence performing unit CS. The sequence performing unit CS transmits a control signal by being operated by a program based on an inputted recipe. Based on the control signal from the controller Cnt, it is possible to control a step of selecting the gas supplied from the gas source group 40, a flow rate of the gas, a gas discharge by the gas discharge device 50, a power supply from the first high-frequency power source 62 and the second high-frequency power source 64, and a step of applying a voltage from the power source 70. Further, the controller Cnt may control, for example, the power supply from the heater power source HP, and the coolant flow rate and the coolant temperature from the chiller unit. Further, respective steps of a method of processing the wafer W disclosed in the present specification may be performed by operating the respective parts of the plasma processing apparatus 10 under control by the sequence performing unit CS of the controller Cnt. The sequence performing unit CS performs the processing of method MT illustrated in FIG. 1 by operating the respective parts of the plasma processing apparatus 10.

Figure 4A:
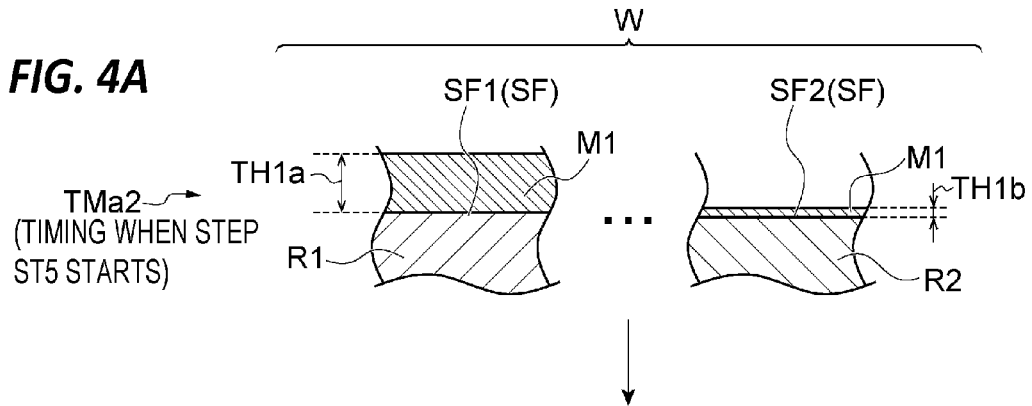
FIG. 4A is a view illustrating a state of a film before performing the sequence illustrated in FIG. 1.
Figure 4B:
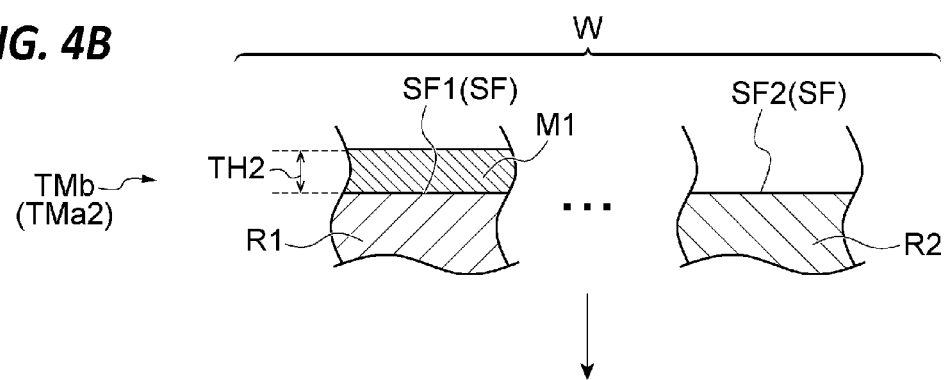
FIG. 4B is a view illustrating a state of the film while performing the sequence illustrated in FIG. 1.
Figure 4C:
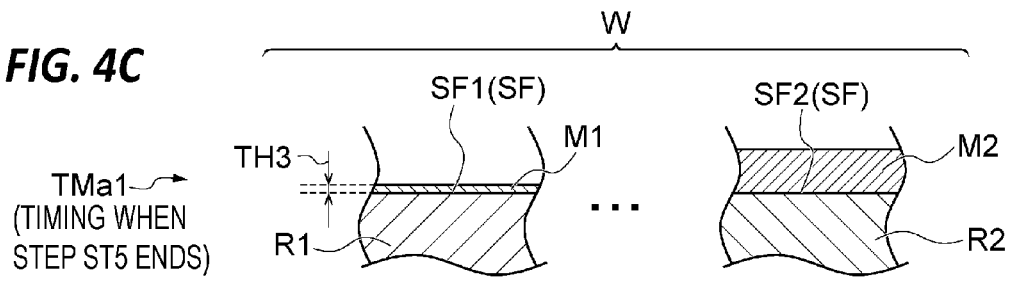
FIG. 4C is a view illustrating a state of the film after performing the sequence illustrated in FIG. 1.

Method MT will be described with reference to FIG. 1. Descriptions will be made on an example in which the plasma processing apparatus 10 is used to perform method MT. The following description will be made with reference to FIGS. 4A, 4B, 4C, 5, and 6. FIGS. 4A to 4C are views illustrating a state of a substrate after performing the respective steps of method MT. Method MT includes step ST1 (first step, first processing), step ST5 (second step, second processing), and step ST4. FIGS. 4A, 4B, 4C, and 5 correspond to a case where step ST1a (cleaning processing) is not performed in step ST1, and FIG. 6 corresponds to a case where step ST1a is performed in step ST1.

Figure 5:
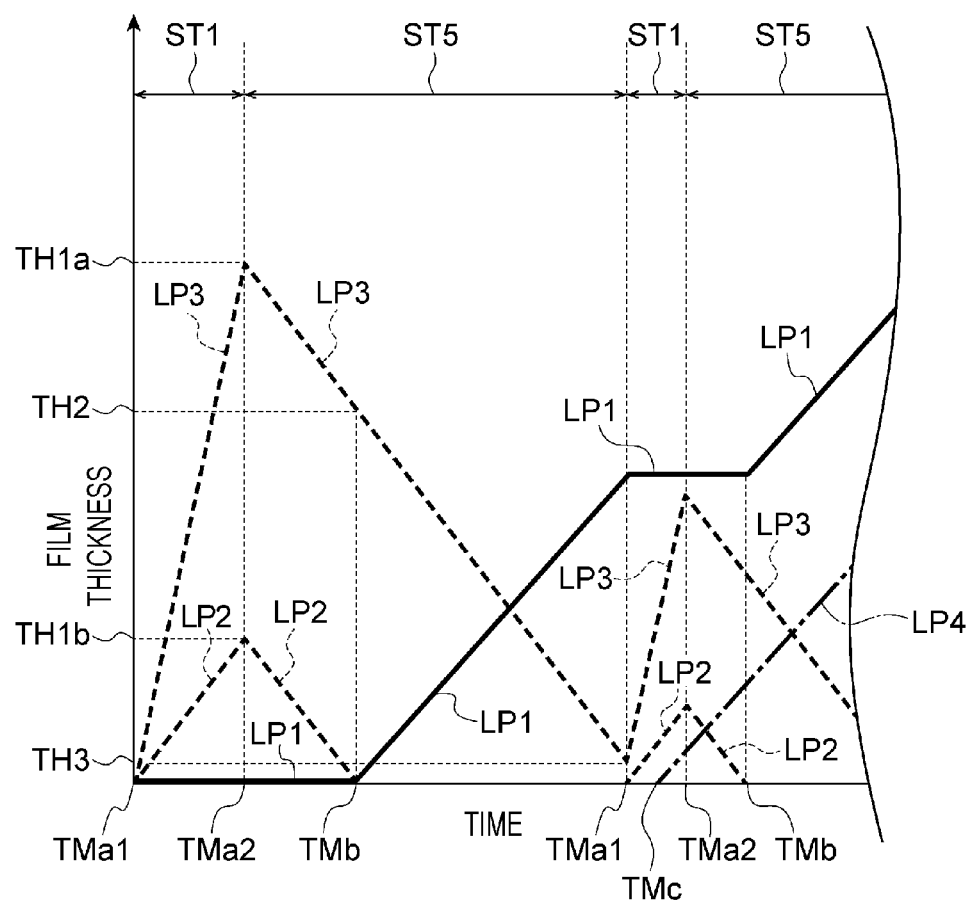
FIG. 5 illustrates a change in film thickness of a second film by the method illustrated in the flowchart in FIG. 1.
Figure 6:
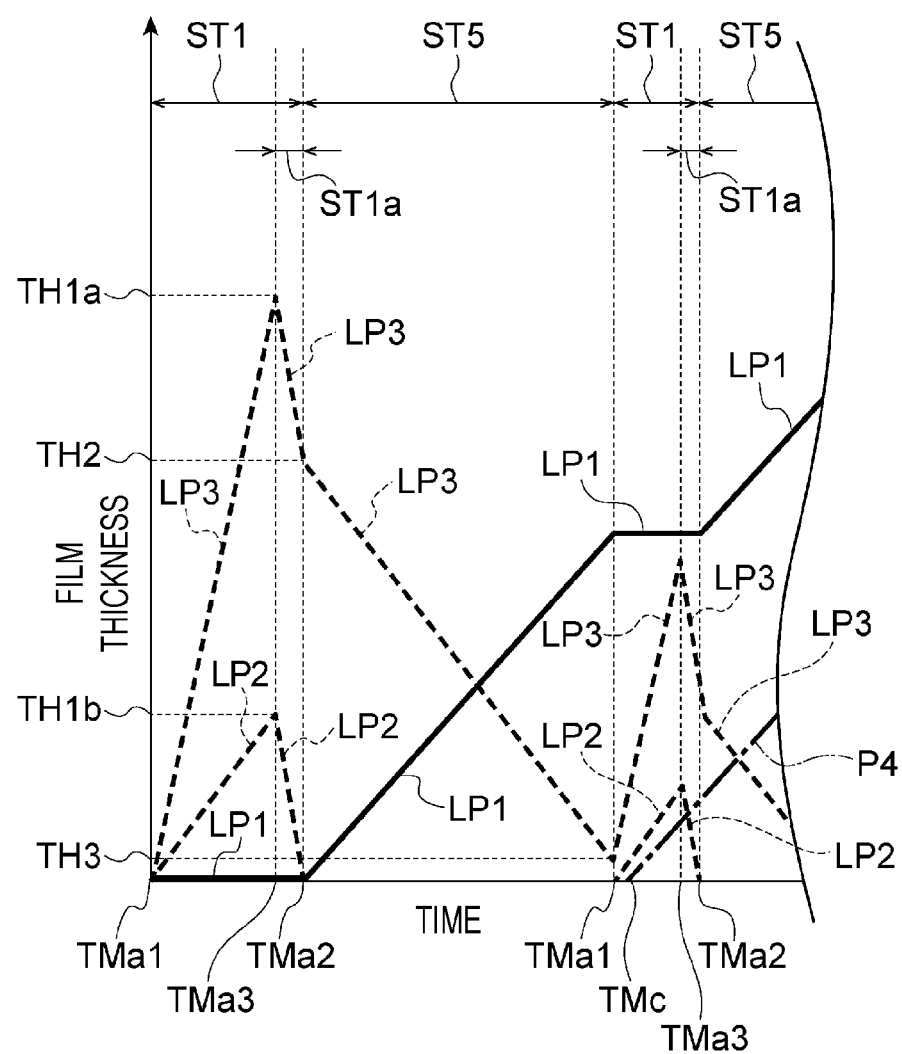
FIG. 6 illustrates another aspect of a change in film thickness of the second film by the method illustrated in the flowchart in FIG. 1.

Horizontal axes, which are illustrated in FIGS. 5 and 6, respectively, indicate the time from the start of method MT. Vertical axes illustrated in FIGS. 5 and 6 indicate a film thickness of a first film M1 and a film thickness of a second film M2, respectively. A line LP1 (solid line), which is illustrated in each of FIGS. 5 and 6, indicates a change in film thickness of the second film M2 formed on a surface SF2. A line LP2 (broken line), which is illustrated in each of FIGS. 5 and 6, indicates a change in film thickness of the first film M1 formed on the surface SF2. The first film M1 formed on the surface SF2 includes the first film M1 formed on the surface SF2 by performing step ST1 for the first time (firstly), and the first film M1 which is formed on a surface of the second film M2 on the surface SF2 by performing step ST1 for the second to subsequent times.

A line LP3 (broken line), which is illustrated in each of FIGS. 5 and 6, indicates a change in film thickness of the first film M1 formed in a region R1.

A thickness TH1a, which is illustrated in each of FIGS. 4A to 4C and FIGS. 5 and 6, is a maximum value of a thickness of the first film M1 formed on a surface SF1 by performing step ST1 for the first time. A thickness TH1b, which is illustrated in each of FIGS. 4A to 4C and FIGS. 5 and 6, is a maximum value of a thickness of the first film M1 formed on the surface SF2 by performing step ST1 for the first time.

A thickness TH2, which is illustrated in each of FIGS. 4A to 4C and FIGS. 5 and 6, is a thickness of the first film M1 on the surface SF1 at a timing (timing TMb in the case of FIGS. 4A, 4B, 4C, and 5 and timing TMa2 in the case of FIG. 6) at which the line LP1 starts rising. A thickness TH3, which is illustrated in each of FIGS. 4A to 4C and FIGS. 5 and 6, is a thickness of the first film M1 on the surface SF1 at the timing when step ST5 ends (the timing when step ST1 restarts).

First, the wafer W having a surface SF is prepared. The wafer W is placed on the placing table PD in the processing container 12 of the plasma processing apparatus 10.

The wafer W has a surface SF. As illustrated in FIGS. 4A to 4C, the surface SF includes the surface SF1 in a first region (region R1) and the surface SF2 in a second region (region R2). The region R1 is included in a region of the wafer W except for the region R2. The region R1 and the region R2 may be made of the same material. As an example, both of the region R1 and the region R2 may be made of the same material including silicon.

As another example, the region R1 and the region R2 may be made of different materials. In this case, the region R1 may be, for example, a photoresist, a metal-containing mask, or a hard mask. The region R1 may be made of any one of silicon, an organic substance, and metal. A specific example of the material of the region R1 may be any one of Si, SiC, an organic film, metal (W, Ti, WC, etc.), SiON, and SiOC.

Meanwhile, the region R2 may be an etched film which is etched through the patterned region R1. A specific example of the region R2 may be any one of $SiO_2$, SiON, SiOC, and SiN.

In method MT, step ST1 is performed first. TMa1 illustrated in FIGS. 4A to 4C and FIGS. 5 and 6 indicates the timing when step ST1 starts when method MT starts, and indicates the timing when step ST5 ends while method MT is performed (the timing when step ST1 restarts).

Step ST1 selectively forms the first film M1 on the surface SF of the wafer W disposed in the processing container 12 by plasma enhanced chemical vapor deposition (PECVD). Specifically, film forming gas and inert gas are supplied into the processing container 12, and high-frequency electric power is supplied, such that plasma is produced from the supplied gas. The first film M1 is formed on the surface SF1 in the region R1 of the wafer W by the produced plasma. In addition, the first film M1 is formed on the surface SF2 in the region R2 of the wafer W (FIG. 4A). The first film M1 formed in the region R1 is thicker than the first film M1 formed in the region R2.

In step ST1, a carbon-containing gas may be used. For example, when fluorocarbon gas is used, a fluorocarbon film is formed as the first film M1. In addition, for example, when fluorohydrocarbon gas is used, a fluorohydrocarbon film is formed as the first film M1. The first film M1 includes carbon atoms and fluorine atoms and has hydrophobicity. For this reason, a precursor layer is not formed on the first film M1, and the second film M2 is not formed in the subsequent step ST5.

Step ST1 may include the cleaning processing (step ST1a) for removing the first film M1 on the surface SF2 (FIG. 6). In this way, step ST1 may form the first film M1 on the surface of the wafer W, and then may remove the first film M1 on the surface of the wafer W. In step ST1a, plasma from oxygen-containing gas, for example, $CO_2$ gas may be used.

Subsequently, step ST5 is performed. The timing TMa2 illustrated in FIGS. 4, 5, and 6 indicates the timing when step ST5 starts after step ST1 (the timing when the step ST1 ends).

Step ST5 has a sequence SQ1 and step ST3. Step ST5 forms the second film M2 by atomic layer deposition in a region of the surface SF of the wafer W where the first film M1 does not exist. More specifically, step ST5 forms the second film M2 by atomic layer deposition on the exposed surface SF of the wafer W. The region where the first film M1 does not exist is a region of the surface SF of the wafer W where the first film M1 is not formed in step ST5. The region in which the first film M1 does not exist may further include a region of the surface SF of the wafer W where the first film formed in step ST1 is removed by the plasma processing before step ST5 or by step ST5. The sequence SQ1 includes step ST2a (third step), step ST2b (fourth step), step ST2c (fifth step), and step ST2d (sixth step). The second film M2 is formed on the surface SF of the wafer W by repeating the sequence SQ1. Step ST1 and step ST5 constitute a sequence SQ2.

Figure 3A:
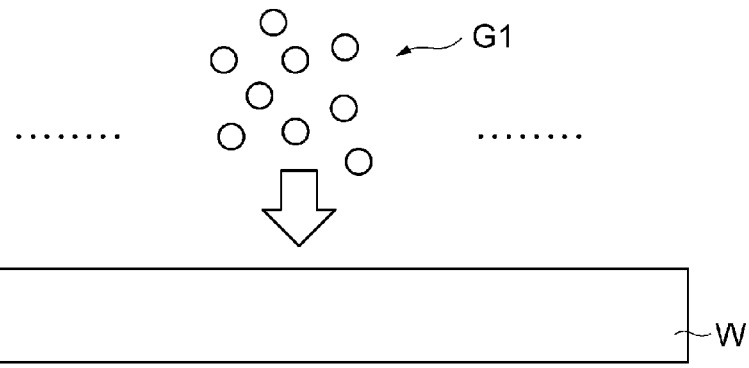
FIG. 3A is a view illustrating a state of a substrate before performing the sequence illustrated in FIG. 1.
Figure 3B:
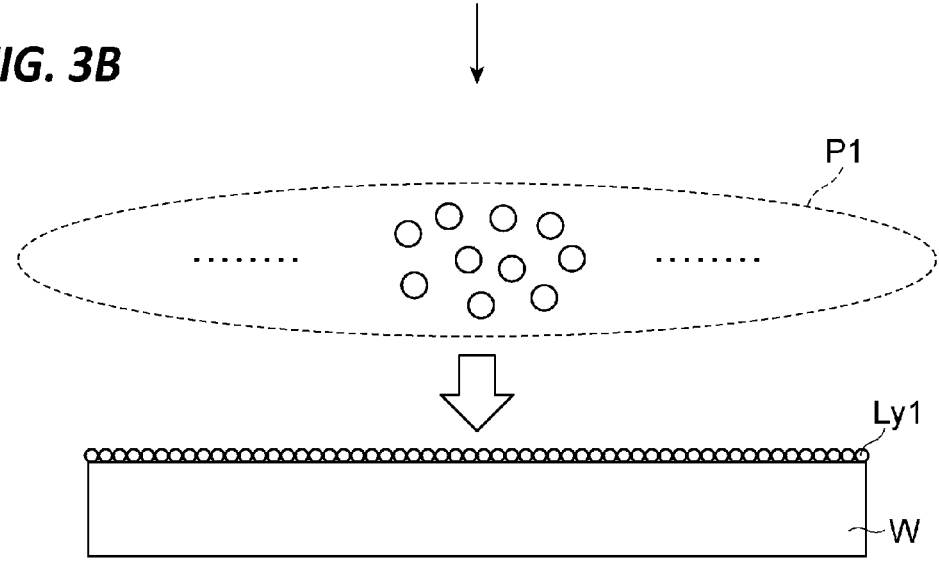
FIG. 3B is a view illustrating a state of the substrate while performing the sequence illustrated in FIG. 1.
Figure 3C:
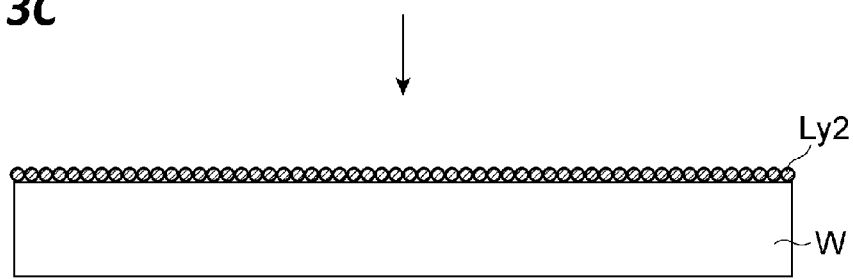
FIG. 3C is a view illustrating a state of the substrate after performing the sequence illustrated in FIG. 1.

The sequence SQ1 represents one cycle of the atomic layer deposition. FIGS. 3A to 3C illustrate a series of steps of the general atomic layer deposition. The atomic layer deposition forms a precursor layer (layer Ly1 illustrated in FIG. 3B) on the surface of the wafer W by using plasma P1 from second gas G1 (gaseous precursor). Subsequently, the second gas G1, which is not adsorbed, is removed by purging the processing space Sp. Subsequently, an atomic layer deposition layer (layer Ly2 illustrated in FIG. 3C) is formed by converting the precursor layer by using plasma for modification. Subsequently, the processing space Sp is selectively purged.

In the sequence SQ1, step ST2a supplies the second gas G1 into the processing container 12 and forms a precursor layer on a region (e.g., the surface SF2) of the wafer W where the first film M1 does not exist. The second gas G1 is chemically adsorbed (chemisorption) to the surface of the wafer W, such that the precursor layer is formed. Any one of aminosilane-based gas, silicon-containing gas, titanium-containing gas, hafnium-containing gas, tantalum-containing gas, zirconium-containing gas, and organic substance-containing gas may be used as the second gas G1. In step ST2a, the plasma from the second gas G1 may be produced or may not be produced.

Step ST2b purges the processing space Sp. The second gas G1 in a gas phase state is removed by the purging. For example, step ST2b purges the processing space Sp by supplying inert gas such as argon or nitrogen gas into the processing container. In this step, gas molecules attached in surplus to a surface OPa inside an opening OP are also removed, such that the precursor layer becomes a monomolecular layer.

In step ST2c, the precursor layer is exposed to the plasma for modification in the processing container 12, such that the precursor layer is converted (modified) into an atomic layer (a part of the second film M2). In this step, third gas is used to convert the precursor layer into a thin film. The third gas may be any one of oxygen-containing gas, nitrogen-containing gas, and hydrogen-containing gas. The third gas may include any one of, for example, $O_2$ gas, $CO_2$ gas, NO gas, $SO_2$ gas, $N_2$ gas, $H_2$ gas, and $NH_3$ gas. Step ST2c supplies the third gas into the processing space Sp. Further, step ST2c supplies the high-frequency electric power from the first high-frequency power source 62 and/or the second high-frequency power source 64, thereby producing plasma (plasma for modification) from the third gas. The produced plasma for modification modifies the precursor layer. In addition, a part of the first film M1 is removed by the plasma for modification, such that the film thickness of the first film M1 is reduced. Therefore, even though the first film M1 is formed on the surface SF2 by step ST1, the first film M1 is removed from the surface SF2 by performing the sequence SQ1 one or more times. In this case, the film thickness of the thin film of the first film M1 formed on the surface SF1 is also decreased.

Subsequently, step ST2d purges the processing space Sp. Specifically, the third gas supplied in step ST2c is discharged. For example, in step ST2d, the gas in the processing space Sp may be discharged by supplying inert gas such as argon or nitrogen gas into the processing space Sp. Further, the sequence SQ1 may not include step ST2d.

As described above, it is possible to form a layer, which constitutes the second film M2, on the surface SF2 to the extent of one layer by completing one cycle of the sequence SQ1. The second film M2 is formed on the surface SF2, which is exposed as the first film M1 is removed, by repeating the sequence SQ1.

In the case illustrated in FIGS. 4A, 4B, 4C, and 5, the timing TMb indicates the timing when the first film M1 on the surface SF2 is completely removed and the surface SF2 is exposed by performing step ST5 (sequence SQ1). In the case illustrated in FIG. 6, the timing TMa2 indicates the timing when the first film M1 on the surface SF2 is completely removed before performing step ST5 and the surface SF2 is exposed by performing step ST1a in step ST1.

The first film M1 on the surface SF1 is also removed while performing step ST5. Therefore, as illustrated in FIGS. 5 and 6, a value of the thickness TH3 of the first film M1 when step ST5 ends is smaller than a value of the thickness (the thickness TH1a in the case in FIG. 5 and the thickness TH2 in the case in FIG. 6) of the first film M1 when step ST5 starts. In addition, in the case in FIG. 5, a value of the thickness TH2 of the first film M1 on the surface SF1 at the timing TMb is smaller than a value of the thickness TH1a of the first film M1 on the surface SF1 at the timing TMa2 when step ST5 starts.

Timing TMc illustrated in FIGS. 5 and 6 indicates the timing when the first film M1 on the surface SF1 is removed, the surface SF1 is exposed, and the second film M2 starts to be formed on the surface SF1. A line LP4 (alternate long and short dashes broken line), which is illustrated in each of FIGS. 5 and 6, indicates a change in film thickness of the second film M2 on the surface SF1 in the case where the second film M2 starts to be formed on the surface SF1 after the timing TMc.

A change in film thickness of the first film M1 and the second film M2 in the sequence SQ1 will be described with reference to FIG. 5. The first film M1 is formed on each of the surface SF1 and the surface SF2 by step ST1. At the timing TMa2 in the case in FIG. 5 or at the timing TMa3 in the case in FIG. 6, the first film M1 having the thickness TH1a is formed on the surface SF1 (line LP3), and the first film M1 having the thickness TH1b is formed on the surface SF2 (line LP2).

A forming speed of the first film M1 on the surface SF1 (an inclination of the line LP3 in step ST1) is higher than (greater than) forming speeds of the first film M1 and the second film M2 on the surface SF2 (an inclination of the line LP2 in step ST1 and an inclination of the line LP1 in step ST5).

In the case in FIG. 5, the first film M1 on the surface SF1 is removed by the continued step ST5, such that the film thickness is decreased. In the case in FIG. 6, the first film M1 on the surface SF1 is removed by step ST1a (cleaning) which starts at the timing TMa3 while performing step ST1 and by step ST5 which is continued from step ST1, such that the film thickness is decreased. Meanwhile, the first film M1 is removed from the surface SF2 by repeating the sequence SQ1, and then the second film M2 is formed on the surface SF2.

The first film M1 on the surface SF1 is removed by repeating the sequence SQ1, and when step ST5 ends, the first film M1 remains on the surface SF1 or the surface SF1 is exposed. The second film M2 is formed on the surface SF2. Therefore, as illustrated in FIGS. 4A to 4C, at the timing TMa when step ST5 ends, the thickness TH3 of the first film M1 on the surface SF1 is zero or smaller than a value of the thickness TH2.

Subsequently, in method MT, step ST3 determines whether to end the sequence SQ1. Specifically, step ST3 determines whether the number of times the sequence SQ1 is repeated reaches a predetermined number of times.

The sequence SQ1 is repeated when it is determined that the number of times the sequence SQ1 is repeated does not reach the predetermined number of times in step ST3 (step ST3: NO). Meanwhile, the sequence SQ1 ends when it is determined that the number of times the sequence SQ1 is repeated reaches the predetermined number of times (step ST3: YES). In this way, method MT repeats step ST5 (sequence SQ1) multiple times.

The number of times the sequence SQ1 is repeated may be determined in accordance with the film thickness of the first film M1. In the embodiment, the number of times the sequence SQ1 is repeated may be determined based on the timing when a part of the first film M1 remains on the surface SF1. In another embodiment, the number of times the sequence SQ1 is repeated may be set based on the timing TMc when the first film M1 is removed from the surface SF1.

In method MT, the sequence SQ2 is performed one or more times. As the sequence SQ2 is repeated, the first film M1 is formed on the first film M1 on the surface SF1, as indicated by the line LP3 in FIG. 5. As indicated by the line LP1 in FIG. 5, the second film M2 is consecutively formed on the surface SF2. The sequence SQ2 is repeated until the second film M2 has a target thickness. In the sequence SQ2, the first film M1 is formed again by step ST1, and the second film M2 is also formed by step ST5. Step ST1 and step ST5 may be consecutively performed in the same processing container (processing container 12) in a state in which a vacuum is maintained in the processing container.

Subsequently, in method MT, step ST4 determines whether to end the sequence SQ2. More specifically, step ST4 determines whether the number of times the sequence SQ2 is repeated reaches a predetermined number of times.

The sequence SQ2 is repeated when it is determined that the number of times the sequence SQ2 is repeated does not reach the predetermined number of times in step ST4 (step ST4: NO). Meanwhile, the sequence SQ2 ends when it is determined that the number of times the sequence SQ2 is repeated reaches the predetermined number of times in step ST4 (step ST4: YES).

Here, the number of times the sequence SQ2 is repeated is determined based on a target film thickness of the second film M2 on the surface SF2. That is, it is possible to adjust the film thickness of the second film M2 by setting the number of times the sequence SQ2 is repeated.

In another embodiment, step ST5 may continue to be performed after the timing TMa1 for the second time has elapsed. In this case, step ST5 is repeated even after the first film M1 on the surface SF1 is removed by step ST5 and the surface SF1 is exposed. As a result, the second film M2 is also formed on the surface SF1. Meanwhile, the second film M2 is formed on the surface SF2, such that the second film M2 becomes thicker.

In another embodiment, in step ST1, step ST1a of cleaning the wafer W may be performed after the first film M1 is formed. When step ST1a is performed, a part of the first film M1 formed on the surface SF of the wafer W is removed, such that the surface SF2 is exposed. Therefore, the second film M2 begins to be formed on the surface SF2 immediately after step ST5 starts (FIG. 6 illustrates a change in film thickness of the second film M2 formed on the surface SF2 in the region R1). In this case, the timing TMa and the timing TMb are the same timing.

As another example, in step ST1, the first film M1, which has different film thicknesses on the surface SF1 and the surface SF2, may be formed by changing a condition of plasma CVD.

Figure 7A:
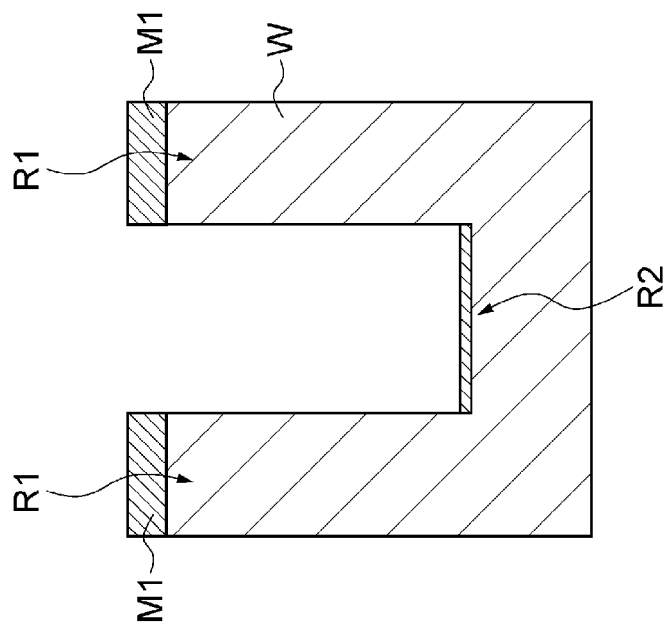
FIG. 7A is a view illustrating an example of a state of a first film formed by isotropic plasma.
Figure 7B:
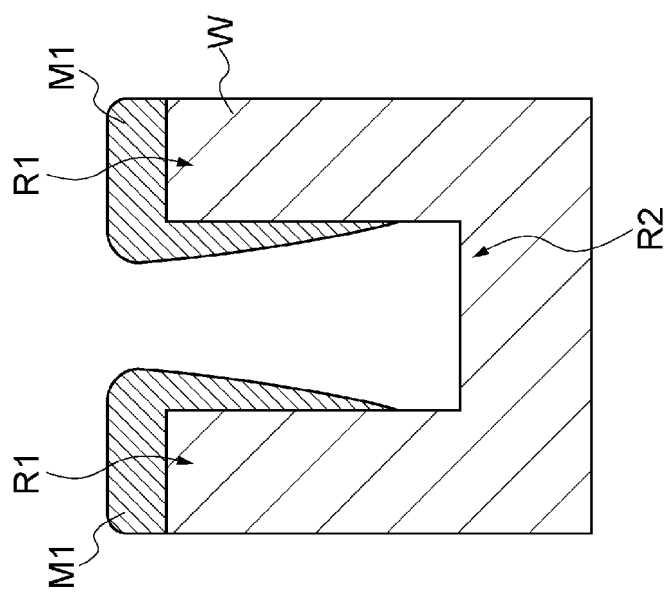
FIG. 7B is a view illustrating an example of a state of a first film formed by anisotropic plasma.

For example, in FIG. 7A, the first film M1 is thickly formed on an upper portion of a pattern, and the first film M1 becomes thinner toward a bottom portion of the pattern. In FIG. 7B, the first film M1 is formed on the upper portion and the bottom portion of the pattern. The first film M1 formed on the upper portion may be thicker than the first film formed on the bottom portion. The first film M1 is rarely formed on a sidewall of the pattern. Further, the pattern illustrated in FIGS. 7A and 7B may be formed by etching which is performed before method MT is performed.

Figure 8:
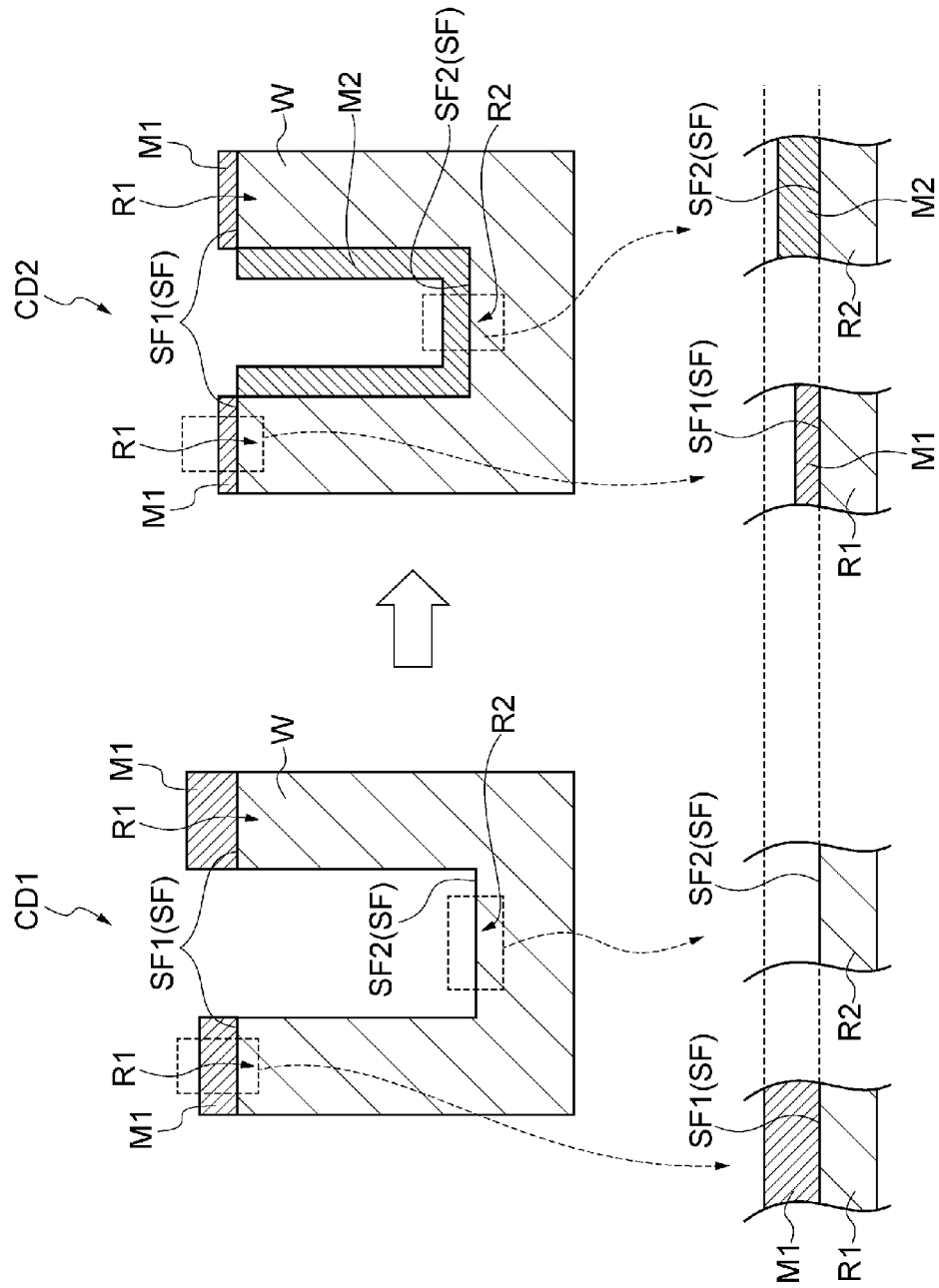
FIG. 8 is a view for explaining an aspect of the film formation and removal in a case where the first film is formed by anisotropic plasma.

A mode, which uses an anisotropic plasma condition in step ST1, will be described with reference to FIG. 8. A pattern is provided on the surface SF of the wafer W. This pattern is formed by etching before method MT is performed. Here, the region R1 is an upper region (low aspect region). The region R2 is a bottom portion (high aspect region). In this example, a surface of the region R1 is referred to as the surface SF1, and a surface of the region R2 is referred to as the surface SF2. As indicated in a state CD1, the first film M1 is thickly formed on the surface SF1, and the first film M1 is thinly formed on the surface SF2 or the first film M1 is not formed on the surface SF2. The state CD1 indicates an example in which the first film is not formed on the surface SF2.

The state CD1 indicates a state in which the first film M1 is formed on the surface SF1 by performing step ST1. The first film M1 is provided only on the surface SF1. In a case where the first film M1 is formed by step ST1 on a surface (e.g., the surface SF2) other than the surface SF1, the state CD1 is made by removing the first film M1 formed on the surface other than the surface SF1 by using, for example, oxygen-containing plasma (step ST1a).

A state CD2 indicates a state of the wafer W at the timing TMa when step ST5, which is performed for the first time, ends and before step ST1 is performed for the second time. A part of the first film M1 is removed by step ST5, such that the first film M1 becomes thinner. The second film M2 is formed on the sidewall and the bottom portion by the atomic layer deposition in step ST5.

Figure 9:
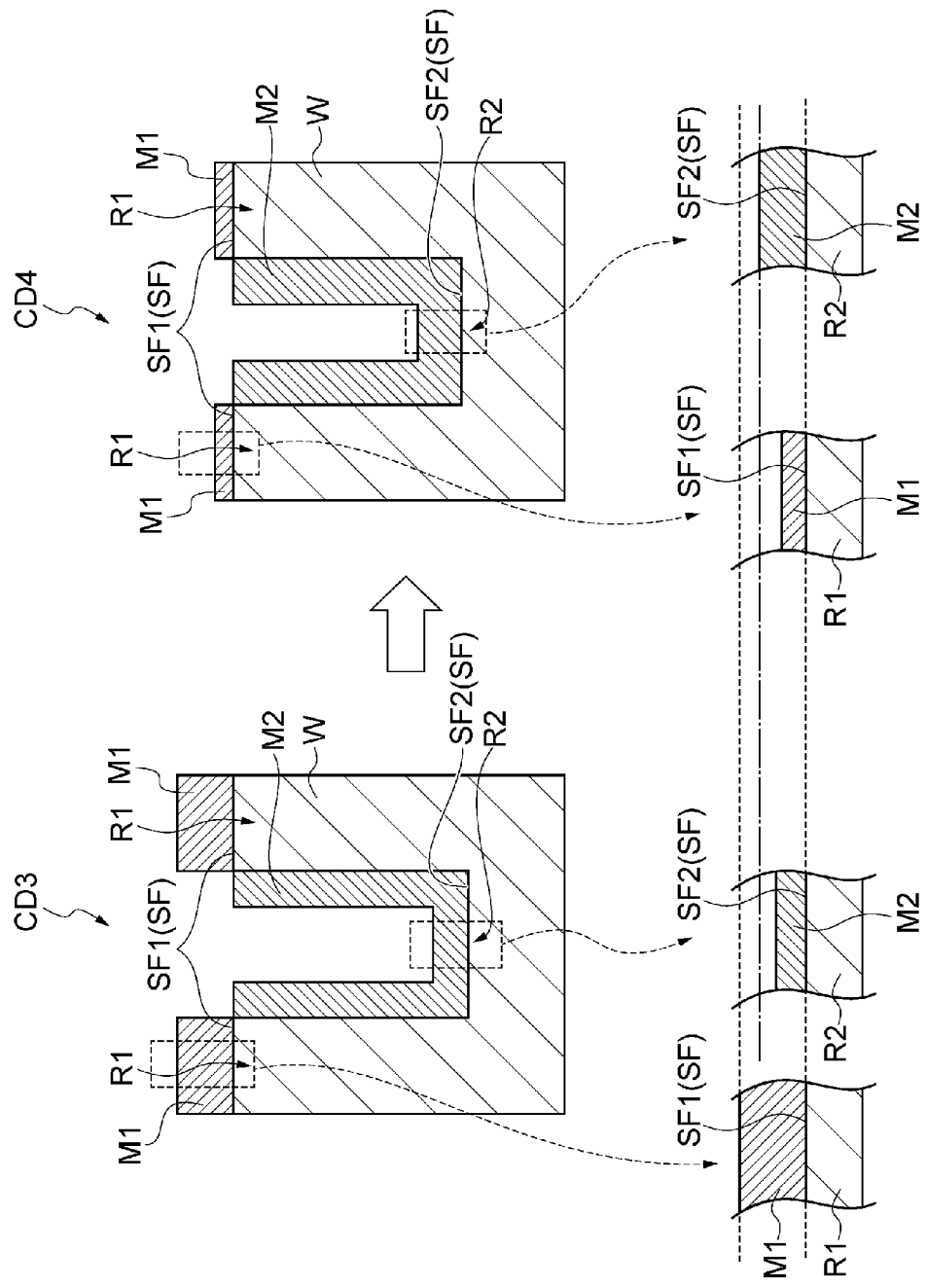
FIG. 9 is a view for explaining an aspect of the film formation and removal in a case where the first film is formed by anisotropic plasma.

Next, see FIG. 9. A state CD3 indicates a state of the wafer W after the state CD2, after step ST1 is performed for the second time, and at the timing TMa when step ST5 starts for the second time. In the state CD3, the first film M1 is formed again as step ST1 is performed for the second time.

A state CD4 indicates the wafer W after the state CD3 and at the timing TMa after step ST5 is performed for the second time (before step ST1 is performed for the third time). The first film M1 is removed by step ST5, such that the first film M1 becomes thinner. On the bottom portion (region R2) of the pattern, the second film M2 is more thickly formed by step ST5. The sequence SQ2 may be performed multiple times so that the second film M2 has a desired thickness. In comparison with the case where the first film M1 is thickly formed at a time, the opening (region R1) is not clogged, and as a result, it is possible to perform the subsequent step ST5 (atomic layer deposition) with high controllability.

Figure 10:
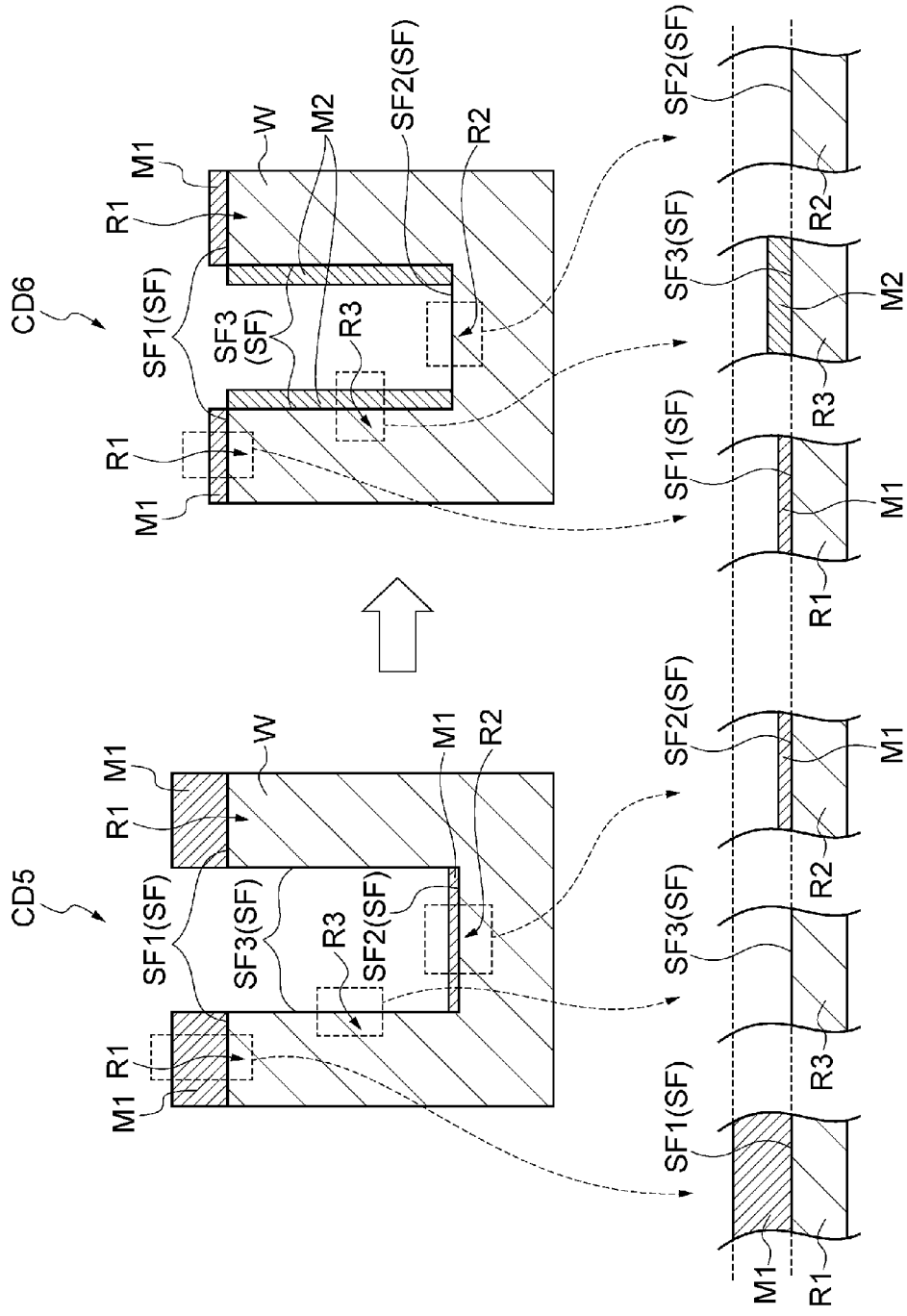
FIG. 10 is a view for explaining an aspect of the film formation and removal in a case where the first film is formed by anisotropic plasma.

FIG. 10 illustrates still another embodiment. A pattern used in the exemplary is formed by etching which is performed before method MT is performed. The etching and method MT may be consecutively performed in the same processing container. A state CD5 indicates a state of the wafer W in a case where the first film M1 is provided in the region R1 at an upper side of a structure (feature) and the region R2 of a bottom portion of the structure by performing step ST1 for the first time. The first film M1 is formed on the surface SF1 and the surface SF2.

A state CD6 indicates the wafer W after step ST5 is performed for the first time (timing TMa) in the state CD5 and before step ST1 is performed for the second time. In the state CD6, the first film M1 on the surface SF1 is removed by step ST5, such that the first film M1 becomes thinner. Meanwhile, the first film M1 on the surface SF2 is removed, such that the surface SF2 is exposed. Meanwhile, the second film M2 is formed on the sidewall (surface SF3) of the structure.

Figure 11:
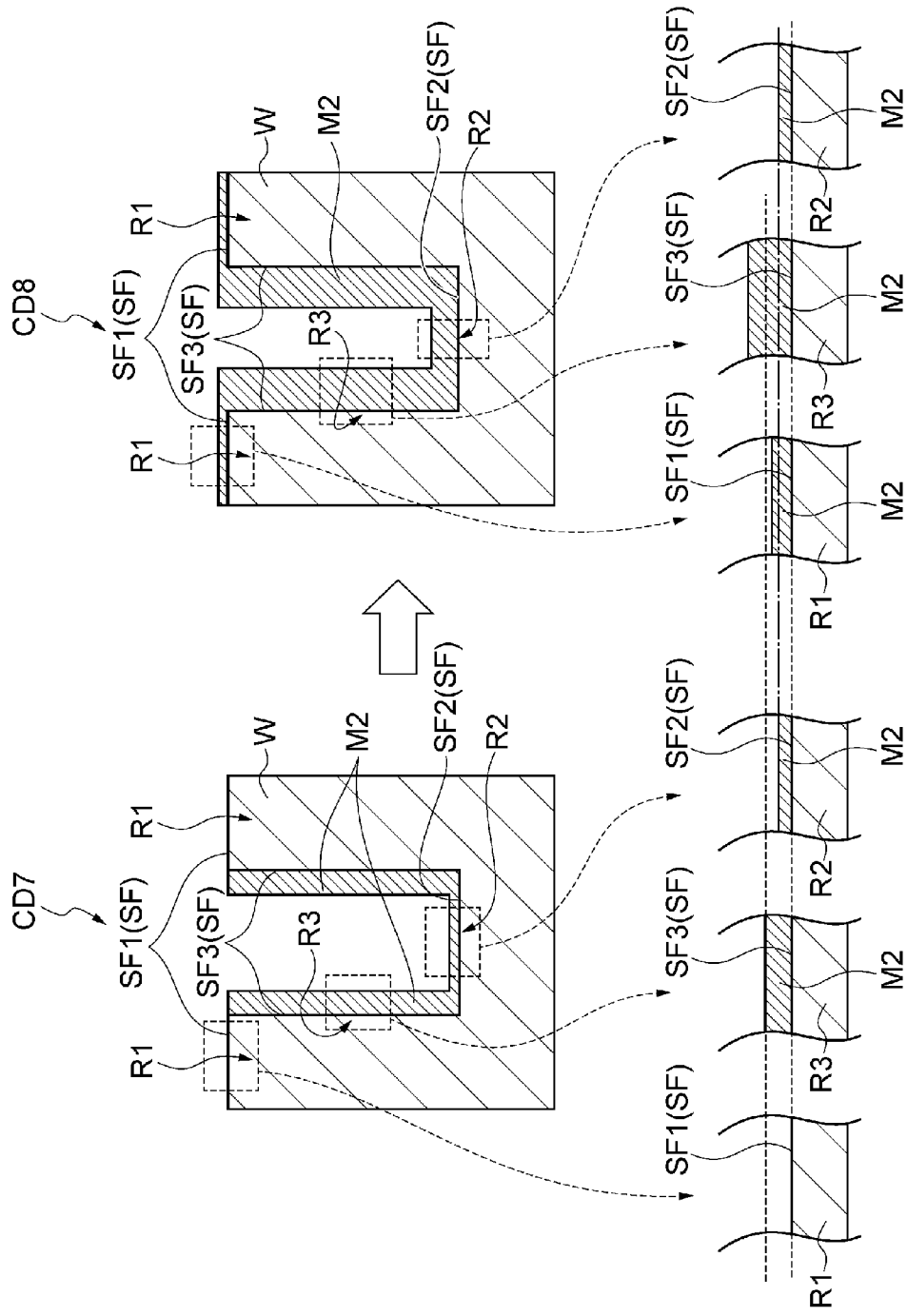
FIG. 11 is a view for explaining an aspect of the film formation and removal in a case where the first film is formed by anisotropic plasma.

A state CD7 illustrated in FIG. 11 indicates the wafer W when step ST5 continues even after the state CD6. When step ST5 is performed, the first film M1 on the surface SF1 is removed, such that the surface SF1 is exposed. The second film M2 is formed on the surface SF2. The second film M2 on the surface SF3 is thicker than the second film M2 on the surface SF2.

A state CD8 illustrated in FIG. 11 indicates the wafer W when step ST5 continues even after the state CD7. The second film M2 is formed by step ST5 on the surface SF1 which is exposed in the state CD7. The second film M2 becomes thinner in the order of the second film M2 on the surface SF3, the second film M2 on the surface SF2, and the second film M2 on the surface SF1. In this way, the second film M2 is formed to have thicknesses that vary depending on the regions including the region R1, the region R2, and the region R3. Here, descriptions have been made on an example in which the anisotropic plasma is used, but the second film having film thicknesses that vary depending on the regions may be similarly formed by repeating step ST5 even in the case where the first film M1 is formed by isotropic plasma.

Descriptions have been made on the example in which the first film M1 is further formed after the state CD6 and the second film having different film thicknesses is formed, but the present disclosure is not limited to this example, and the region R2 may be etched after the state CD6. With this configuration, since the second film M2 is formed on the sidewall (surface SF3) of the structure, it is possible to inhibit bowing during the etching. Method MT and the subsequent etching may be performed in the same processing container. Therefore, throughput may be improved.

Multiple specific examples of a processing condition, which may be used for step ST1, step ST2a, and step ST2c, are described in Example 1 and Example 2.

Example 1

The plasma CVD is performed in step ST1. The surface SF of the wafer W includes an $SiO_2$ film and a Si mask provided on the $SiO_2$ film.
<Step ST1>
Pressure in Processing Space Sp: 20 [mTorr]
Electric Power by First High-Frequency Power Source 62: 300 [W]
Electric Power by Second High-Frequency Power Source 64: 0 [W]
First Gas Flow Rate: $C_4F_6$ Gas (30 [sccm])/Ar Gas (300 [sccm])
Temperature of Wafer W: 40[° C.]
Performance Time: 15 [sec]

<Step ST2a>
Pressure in Processing Space Sp: 100 [mTorr]
Electric Power by First High-Frequency Power Source 62: 0 [W]
Electric Power by Second High-Frequency Power Source 64: 0 [W]
First Gas Flow Rate: Aminosilane-based Gas (50 [sccm])
Temperature of Wafer W: 10[° C.]
Performance Time: 15 [sec]
<Step ST2c>
Pressure in Processing Space Sp: 200 [mTorr]
Electric Power by First High-Frequency Power Source 62: 300 [W]
Electric Power by Second High-Frequency Power Source 64: 0 [W]
First Gas Flow Rate: $CO_2$ Gas (300 [sccm])
Temperature of Wafer W: 10[° C.]
Performance Time: 10 [sec]

Example 2

In Example 2, anisotropic plasma CVD is performed in step ST1. The surface SF of the wafer W is divided by the Si mask provided on the $SiO_2$ film of the surface SF of the wafer W.
<Step ST1>
Pressure in Processing Space Sp: 30 [mTorr]
Electric Power by First High-Frequency Power Source 62: 0 [W]
Electric Power by Second High-Frequency Power Source 64: 25 [W]
First Gas Flow Rate: $C_4F_6$ Gas (40 [sccm])/Ar Gas (1000 [sccm])
Temperature of Wafer W: 60[° C.]
Performance Time: 15 [sec]
<Step ST2a>
Pressure in Processing Space Sp: 200 [mTorr]
Electric Power by First High-Frequency Power Source 62: 0 [W]
Electric Power by Second High-Frequency Power Source 64: 0 [W]
First Gas Flow Rate: Aminosilane-based Gas (100 [sccm])
Temperature of Wafer W: 60[° C.]
Performance Time: 15 [sec]
<Step ST2c>
Pressure in Processing Space Sp: 200 [mTorr]
Electric Power by First High-Frequency Power Source 62: 500 [W]
Electric Power by Second High-Frequency Power Source 64: 0 [W]
First Gas Flow Rate: $CO_2$ Gas (300 [sccm])
Temperature of Wafer W: 60[° C.]
Performance Time: 2 [sec]

In method MT described above, the plasma produced in step ST1 may be any one of the anisotropic plasma and the isotropic plasma, and the plasma may be adjusted in accordance with a distribution of the film thicknesses of the second film M2. In another aspect, step ST1 of performing the anisotropic plasma CVD and step ST1 of performing the isotropic plasma CVD may be repeated when repeating the sequence SQ2. In still another aspect, the anisotropic plasma CVD and the isotropy plasma CVD may be sequentially performed while step ST1 is performed for the first time. In addition, a CVD condition when step ST1 is performed for the $m^{th}$ (m is a positive integer) time may be different from a CVD condition when step ST1 is performed for the $(m+1)^{th}$ time. Therefore, the location where the first film M1 is formed may be changed, and as a result, it is possible to form a distribution of the film thicknesses of the first film M1.

In method MT described above, the plasma CVD condition performed in step ST1 may be variously changed. Here, a case where the pattern is provided on the surface of the wafer W by etching is considered. The pattern has a low aspect region and a high aspect region. In one aspect, the types of first gas used in step ST1 may be changed. For example, $C_4F_6$ gas or $C_4F_8$ gas may be used as the first gas. An attachment coefficient of $C_4F_6$ gas is larger than an attachment coefficient of $C_4F_8$ gas. Therefore, when $C_4F_6$ is used, a larger amount of the first film M1 is formed at the surface side (low aspect region) of the wafer W. Meanwhile, when $C_4F_8$ is used, a larger amount of the first film M1 is formed at the bottom portion side (high aspect region). In this way, since the attachment coefficient varies depending on the types of gas, it is possible to control a position where the first film M1 is formed by changing the type of gas.

The electric power of the second high-frequency power source 64 may be changed. As an example, the electric power may be turned on and off. As another example, a value of the electric power may be changed between a high value and a low value. When the value of the electric power is increased, the first film M1 is thickly formed on horizontal surfaces (upper surface and bottom portion) of the structure, as illustrated in FIG. 7B. Meanwhile, the first film M1 formed on the sidewall is thin. When the value of the electric power is decreased, a larger amount of the first film M1 is formed at an upper side.

In another aspect, a temperature of the wafer at the time of performing step ST1 may be changed. When the temperature at the time of performing step ST1 is relatively high, a large amount of the first film M1 is formed at the bottom portion side (high aspect region). When the temperature at the time of performing step ST1 is relatively low, a larger amount of the first film M1 is formed at the surface side (low aspect region) of the wafer W.

Pressure at the time of performing step ST1 may be changed. When the pressure is relatively high, the produced plasma is isotropic. The thicker first film M1 is formed at the surface side (low aspect region) of the wafer W by the isotropic plasma. Meanwhile, when the pressure is relatively low, the produced plasma is anisotropic. The thicker first film M1 is formed at the bottom portion side (high aspect region) by the anisotropic plasma.

A dissociative state of the plasma may be changed by changing electric power of the first high-frequency power source 62 at the time of performing step ST1. Therefore, produced radical species or a radical proportion is changed by changing the electric power, and as a result, the attachment coefficient at the time of forming the first film M1 is changed.

In method MT described above, a condition of a step 5 may be variously changed. As an example, it is possible to change the performance time of step ST2c (the time when the plasma is produced). A removal amount of the first film M1 may be adjusted by the aforementioned change.

In step ST2c, it is possible to change electric power of the second high-frequency power source 64. When the electric power of the second high-frequency power source 64 is relatively high, a larger amount of the first film M1 on a horizontal portion (the upper surface or the bottom portion) of the structure (feature) is removed. When the electric power of the second high-frequency power source 64 is relatively low, the amount of removed sidewall portion (sidewall) of the structure of the first film M1 is increased.

In step ST2c, the pressure in the processing container 12 may be changed. When the pressure is relatively high, energy of ions in the plasma is decreased, such that an isotropic reaction may be dominant. When the pressure is relatively low, energy of ions in the plasma is increased, such that an anisotropic reaction may be dominant. Therefore, it is possible to adjust, by changing the pressure, the region in which the first film M1 is removed and the removal amount for each region.

It is possible to change the electric power of the first high-frequency power source 62 at the time of performing step ST2c. When the electric power is relatively high, plasma density may be increased.

With the aforementioned configuration, in the case where step ST1 and step ST5 are repeatedly performed, one or more conditions among the aforementioned conditions of step ST1 or step ST5 may be different between when the step is performed for the $m^{th}$ (m is a positive integer) time and when the step is performed for the $(m+1)^{th}$ time. When the second film M2 is selectively formed in the region R2 by repeatedly performing the sequence SQ1, one or more conditions among the aforementioned conditions of step ST2c may be different between when the step is performed for the $n^{th}$ (n is a positive integer) time and when the step is performed for the $(n+1)^{th}$ time. Therefore, controllability in performing the first film M1 and/or the second film M2 is improved.

The performance time of step ST2a is adjusted, for example, within a range of 2 seconds to 10 seconds, and as a result, it is possible to control the removal amount of the first film M1. In this case, the removal amount of the first film M1 may be 1 nm or less (e.g., 0.1 nm to 0.5 nm) for each cycle of the sequence SQ1. In addition, in the case where the second film M2 includes $SiO_2$, the deposition amount of the second film M2 is a monoatomic layer (i.e., about 0.2 nm) for each cycle of the sequence SQ1. For example, in a case where fluorocarbon is provided with about 10 nm as the first film M1, the first film M1 is removed by performing 10 to 100 cycles of the sequence SQ1, and the second film M2 is formed with about 2 to 20 nm. The first gas for forming the first film M1 is selected in accordance with the purpose, and the first gas may include, for example, a CF-based gas, a CHF-based gas, a CO gas, or a CH gas.

In method MT, step ST1 and step ST5 may be performed separately in the processing container of the plasma processing apparatus. Step ST1 forms the first film M1 in the region R1 of the wafer W in a first processing container by plasma enhanced chemical vapor deposition by using the plasma from the first gas. Step ST5 forms, by atomic layer deposition, the second film M2 in the region R2 of the surface of the wafer W in a second processing container where the first film M1 is not formed. In method MT, the step ST1 and step ST5 are repeatedly performed.

Method MT according to the embodiment may be performed by using an inductively coupled plasma processing apparatus. Similar to the plasma processing apparatus 10, the inductively coupled plasma processing apparatus has the gas supply system (the gas source group 40, the valve group 42, the flow rate controller group 45, the gas supply pipe 38, the gas supply pipe 82, etc.).

Method MT may be performed solely, but the pattern may be formed by etching the wafer W in the processing container 12 before performing method MT. In another aspect, the wafer W may be etched in the processing container 12 after performing method MT. Method MT and the etching may be consecutively performed in the same processing container in a state in which a vacuum is maintained in the processing container. Further, in another aspect, method MT and the etching may be repeatedly performed in the same processing container. Since the substrate may be processed in the same processing container without transporting the substrate, throughput is improved. Meanwhile, method MT and the etching may be performed by using separate processing containers. In this case, a plasma exciting method for method MT and a plasma exciting method for the etching may be different from each other.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:
providing a substrate;
selectively forming a first film on a surface of the substrate by plasma enhanced chemical vapor deposition (PECVD); and
forming a second film in a region of the substrate where the first film does not exist,
wherein the forming of the second film includes:
forming a precursor layer on the surface of the substrate by supplying a gaseous precursor to the substrate,
converting the precursor layer into the second film by exposing the precursor layer to plasma for modification of the precursor layer, and
during the forming of the second film, a film thickness of the first film decreases.

2. The substrate processing method of claim 1, further including repeatedly performing the selectively forming the first film and the forming of the second film.

3. The substrate processing method of claim 1, wherein the region of the substrate where the first film does not exist is (1) a region where the first film is not formed during the selectively forming the first film or (2) a region in which the first film is formed with a smaller thickness than a thickness of the first film on the surface of the substrate during the selectively forming the first film and the smaller thickness film is removed.

4. The substrate processing method of claim 1, wherein the region where the first film does not exist includes a region in which the first film is formed during the selectively forming the first film, and the first film is removed by a plasma processing before the forming of the second film or during the forming of the second film.

5. The substrate processing method of claim 1, comprising, after selectively forming the first film on the surface of the substrate, removing at least a portion of the first film on the surface of the substrate.

6. The substrate processing method of claim 1, wherein the selectively forming of the first film and the forming of the second film are consecutively performed in a same processing container in a state where a vacuum is maintained in the processing container.

7. The substrate processing method of claim 1, further comprising:
etching the substrate in a processing container before the selectively forming of the first film; and etching the substrate in the processing container after the forming of the second film.

8. The substrate processing method of claim 1, wherein the forming of the second film includes repeatedly performing a sequence including:
the forming of the precursor layer on the surface of the substrate by supplying the gaseous precursor into a processing container in which the second film is formed;
purging an interior of the processing container after the forming of the precursor layer;
after the purging, the converting the precursor layer into the second film by exposing the precursor layer to plasma; and
purging a space in the processing container after the converting of the precursor layer.

9. The substrate processing method of claim 8, wherein the gaseous precursor is any one of an aminosilane-based gas, a silicon-containing gas, a titanium-containing gas, a hafnium-containing gas, a tantalum-containing gas, a zirconium-containing gas, or an organic substance-containing gas, and wherein the plasma for converting the precursor layer is produced from any one of an oxygen-containing gas, a nitrogen-containing gas, or a hydrogen-containing gas.

10. The substrate processing method of claim 8, wherein as the sequence is repeatedly performed, conditions during the converting of the precursor layer are different between when the converting is performed for the $n^{th}$ (n is a positive integer) time and when the converting is performed for the $(n+1)^{th}$ time.

11. The substrate processing method of claim 8, wherein as the selectively forming of the first film and the forming of the second film are repeatedly performed, conditions of the selectively forming of the first film are different between when the selectively forming is performed for the $m^{th}$ (m is a positive integer) time and when the selectively forming is performed for the $(m+1)^{th}$ time.

12. A substrate processing method comprising:
providing a substrate;
etching an opening in the substrate;
after etching of the opening, selectively forming a first film on a selective region of a surface of the substrate by plasma enhanced chemical vapor deposition (PECVD), wherein the selective region of the surface where the first film is formed includes at least surface portions outside of said opening; and
forming a second film on surface portions of the substrate where the first film does not exist, wherein the surface portions of the substrate where the first film does not exist include surface portions inside of said opening,
wherein the method includes, during forming of the second film, forming a precursor layer on the surface portions inside of said opening, by supplying a gaseous precursor to the substrate, and converting the precursor layer into the second film by exposing the precursor layer to plasma for modification of the precursor layer, and the plasma for modification of the precursor layer reduces a film thickness of the first film.

13. The substrate processing method of claim 12, further including repeatedly performing the selectively forming of the first film and the forming of the second film.

14. A substrate processing method comprising:
providing a substrate in a processing container;
etching an opening in the substrate;
after etching of the opening, selectively forming a first film on a selective region of a surface of the substrate disposed in the processing container by plasma enhanced chemical vapor deposition (PECVD), wherein the selective region of the surface where the first film is formed includes at least surface portions outside of said opening; and forming a second film by atomic layer deposition (ALD) on surface portions of the substrate where the first film does not exist, wherein the surface portions of the substrate where the first film does not exist include surface portions inside of said opening, wherein the method includes, during forming of the second film, forming a precursor layer on the surface portions inside of said opening, by supplying a gaseous precursor into the processing container, purging an interior of the processing container, and converting the precursor layer into the second film by exposing the precursor layer to plasma for modification of the precursor layer in the processing container, and the plasma for modification of the precursor layer reduces a film thickness of the first film, wherein the second film has a film thickness that varies at different regions of the surface.

15. A plasma processing apparatus comprising:
at least one processing container which receives a substrate; and
a controller configured to control a processing performed on the substrate,
wherein the controller includes a sequence performing unit which repeatedly performs a sequence including selectively forming a first film on a selective region of a surface of the substrate by using plasma enhanced chemical vapor deposition (PECVD), and forming a second film in a region of the surface where the first film does not exist,
wherein the forming of the second film includes:
forming a precursor layer on the surface of the substrate by supplying a gaseous precursor to the substrate,
converting the precursor layer into the second film by exposing the precursor layer to plasma for modification of the precursor layer, and
during the forming of the second film, a film thickness of the first film decreases.

16. The plasma processing apparatus of claim 15, wherein the sequence performing unit of the controller is configured to repeatedly perform the selectively forming the first film and the forming of the second film.

17. The plasma processing apparatus of claim 15, wherein the sequence performing unit of the controller is configured to form the first film on the surface of the substrate, and then remove at least a portion of the first film on the surface of the substrate.

18. The plasma processing apparatus of claim 15, wherein the sequence performing unit of the controller is configured to perform the forming of the second film by repeatedly performing a sequence including:
the forming of the precursor layer on the surface of the substrate by supplying the gaseous precursor into a processing container of the at least one processing container in which the second film is formed;
purging an interior of the processing container after forming the precursor layer;
after the purging, the converting the precursor layer into the second film by exposing the precursor layer to plasma; and
purging a space in the processing container after the converting of the precursor layer.

19. The plasma processing apparatus of claim 15, wherein the sequence performing unit of the controller is configured to consecutively perform the selectively forming of the first film and the forming of the second film in a same processing container in a state where a vacuum is maintained in the processing container.

20. The plasma processing apparatus of claim 15, wherein the sequence performing unit of the controller is configured to perform an etching of the substrate before the selectively forming of the first film; and to perform an etching of the substrate after the forming of the second film.

* * * * *